United States Patent
Lee et al.

(10) Patent No.: US 9,135,968 B2
(45) Date of Patent: Sep. 15, 2015

(54) METHOD OF OPERATING A SEMICONDUCTOR MEMORY DEVICE

(75) Inventors: Byung In Lee, Hwaseong-si (KR); Byeong Il Han, Busan (KR)

(73) Assignee: SK Hynix Inc., Gyeonggi-do (KR)

( * ) Notice: Subject to any disclaimer, the term of this patent is extended or adjusted under 35 U.S.C. 154(b) by 307 days.

(21) Appl. No.: 13/602,099

(22) Filed: Aug. 31, 2012

(65) Prior Publication Data

US 2013/0272081 A1    Oct. 17, 2013

(30) Foreign Application Priority Data

Apr. 12, 2012  (KR) .......................... 10-2012-0037938

(51) Int. Cl.
*G11C 7/00* (2006.01)
*G11C 16/06* (2006.01)
*G11C 7/12* (2006.01)
*G11C 16/04* (2006.01)
*G11C 16/26* (2006.01)
*G11C 16/34* (2006.01)

(52) U.S. Cl.
CPC .............. *G11C 7/12* (2013.01); *G11C 16/0483* (2013.01); *G11C 16/26* (2013.01); *G11C 16/3427* (2013.01)

(58) Field of Classification Search
CPC ...... G11C 7/12; G11C 16/3427; G11C 16/26; G11C 16/0483
USPC ............. 365/185.13, 185.21, 185.24, 189.15, 365/203, 185.25
See application file for complete search history.

(56) References Cited

U.S. PATENT DOCUMENTS 7,539,059 B2 *   5/2009   Lee et al. ................. 365/185.21
2005/0105359 A1 *   5/2005   Matsunaga .................... 365/222

FOREIGN PATENT DOCUMENTS

KR         1020120020388 A       3/2012

* cited by examiner

*Primary Examiner* — Tha-O H Bui
(74) *Attorney, Agent, or Firm* — William Park & Associates Ltd.

(57) ABSTRACT

A semiconductor memory device is operated by, inter alia, selecting an even bit line or an odd bit line in response to a read command, and precharging the selected bit line by applying a precharge voltage to the selected bit line; changing potential of the selected bit line in response to a threshold voltage of a selected memory cell coupled to the selected bit line; precharging a non-selected bit line by applying a precharge voltage to the non-selected bit line; and sensing read data in accordance with the potential of the selected bit line.

12 Claims, 7 Drawing Sheets

METHOD OF OPERATING A SEMICONDUCTOR MEMORY DEVICE

CROSS-REFERENCE TO RELATED APPLICATION

This application claims priority from Korean Patent Application No. 10-2012-0037938, filed on Apr. 12, 2012, the contents of which are incorporated herein by reference in its entirety.

BACKGROUND

The present invention relates generally to a method of operating a semiconductor memory device.

A memory cell of a semiconductor memory cell is programmed or erased through F-N tunneling. Electrons are charged into a floating gate of the memory cell in response to a program operation, and the electrons charged in the floating gate are discharged in response to an erase operation. The threshold voltage of the memory cell varies depending on the amount of the electrons charged into the floating gate, and data is determined in response to the threshold voltage level detected by a read operation.

A multi-level cell that can store multi-level data of more than two bits is used as the memory cell to increase capacity of data stored in a semiconductor memory device. The memory cell may store data having various states by varying the magnitude of the threshold voltage by adjusting the amount of electric charge in the floating gate of the multi-level cell. A program method of the multi-level cell has been widely used because it increases considerable capacity of a non-volatile memory cell.

However, the time required for a program operation increases as multiple logical pages are programmed into one physical page and where the program operation grows in complexity. The width between threshold voltage distributions narrows as the number of the threshold voltage distributions increases, thereby reducing read margins. As a result, it is increasingly difficult to read data.

An active area, e.g. a channel area, becomes narrow due to a cross coupling phenomenon between a non-selected bit line and a selected bit line when a read operation or a verifying operation of data is performed, and since cell current decreases, it is difficult to read data accurately.

SUMMARY OF THE INVENTION

Various embodiments of the present invention provides a method of operating a semiconductor memory device to prevent reduction of an active area due to cross coupling between adjoining memory cells when data stored in a memory cell is read.

A method of operating a semiconductor memory device in response to an embodiment of the present invention includes selecting an even bit line or an odd bit line in response to a read command, and precharging the selected bit line by applying a precharge voltage to the selected bit line; changing potential of the selected bit line in response to a threshold voltage of a selected memory cell coupled to the selected bit line; precharging a non-selected bit line by applying a precharge voltage to the non-selected bit line; and sensing read data in accordance with the potential of the selected bit line.

A method of operating a semiconductor memory device in response to another embodiment of the present invention includes turning off source select transistors of cell strings in response to a read command; precharging a bit line by applying a precharge voltage to the bit line coupled to the cell strings; turning on the source select transistors of the cell strings; changing potential of the bit line in response to a threshold voltage of a selected memory cell included in each of the cell strings; and sensing read data in response to a voltage of the bit line.

A method of operating a semiconductor memory device of the present invention prevents reduction of an active area of a memory cell due to cross coupling between adjoining memory cells when a read operation or a verifying operation is performed, and since cell current passing through a selected memory cell in a read operation or a verifying operation does not decrease, accuracy of the read operation or the verifying operation may be enhanced.

BRIEF DESCRIPTION OF THE DRAWINGS

The above and other features as well as advantages of the present invention will become readily apparent by reference to the following detailed description when considered in conjunction with the accompanying drawings wherein.

DESCRIPTION OF SPECIFIC EMBODIMENTS

Hereinafter, the preferred embodiments of the present invention will be explained in more detail with reference to the accompanying drawings. Although embodiments have been described with reference to a number of illustrative embodiments thereof, it should be understood that numerous other modifications and embodiments can be devised by those skilled in the art that will fall within the spirit and scope of the principles of this disclosure.

Figure 1:
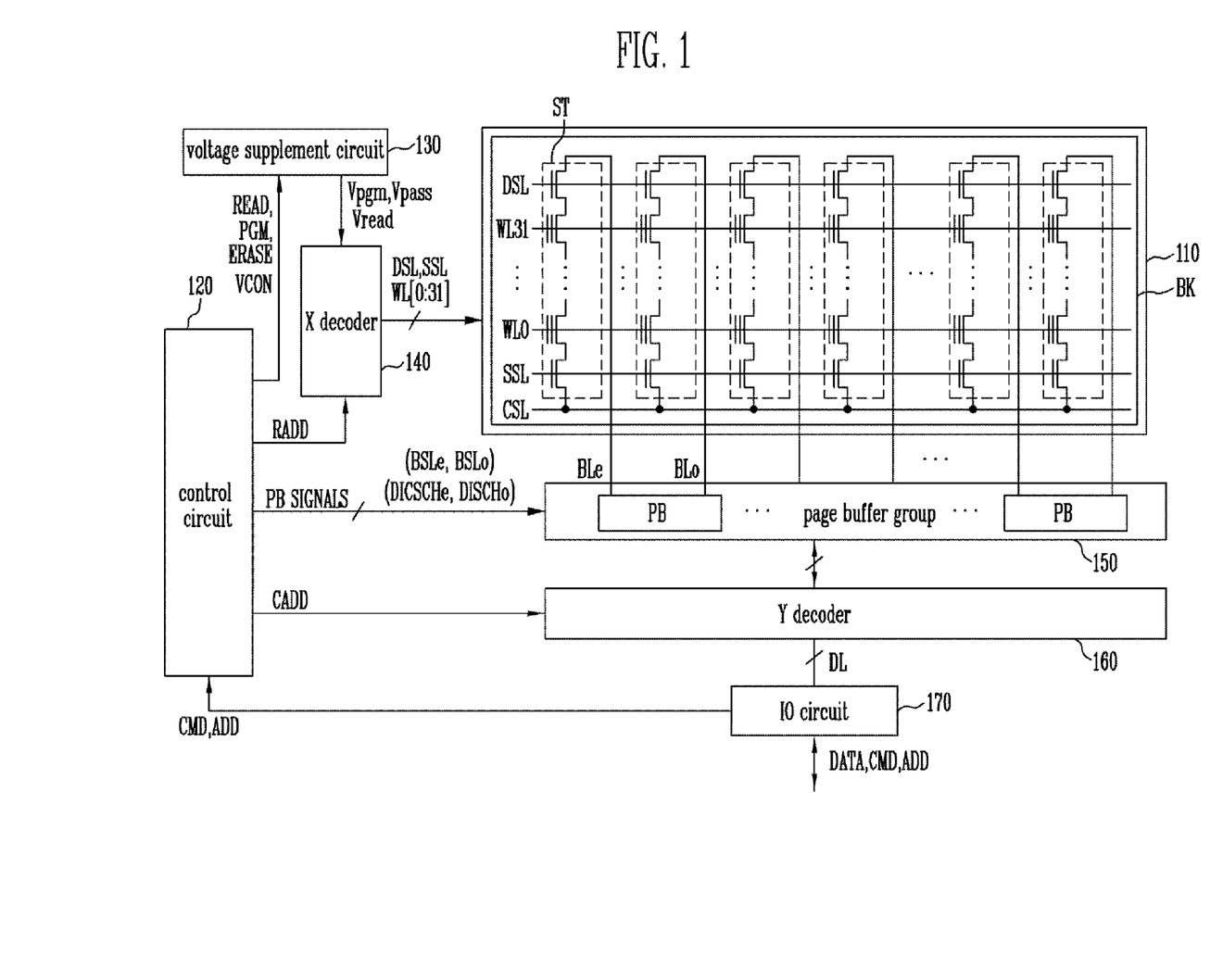
FIG. 1 is a view illustrating a semiconductor memory device in response to an embodiment of the present invention.

FIG. 1 is a view illustrating a semiconductor memory device in response to an embodiment of the present invention.

In FIG. 1, a semiconductor memory device includes a memory cell array 110 having memory blocks BK where memory cells are coupled to bit lines and word lines.

The semiconductor memory device includes a peripheral circuit group 130 to 170 to either program the memory cells or read data stored in the memory cell, and a control circuit 120 to control the peripheral circuit group 130 to 170.

The peripheral circuit group 130 to 170 includes a voltage supplement circuit 130, an X decoder 140, a page buffer group 150, a Y decoder 160 and an IO circuit 170.

The voltage supplement circuit 130 generates an operation voltage, e.g. a program voltage Vpgm, a read voltage Vread or an erase voltage Verase in response to a voltage control signal and operation mode signals PGM, READ, ERASE, etc. outputted from the control circuit 120.

The operation voltages Vpgm, Vpass, Vread, etc. generated by the voltage supplement circuit 130 are provided to the X decoder 140 through global word lines.

The X decoder 140 selects one memory block BK in the memory cell array 110 in response to a row address RADD inputted from the control circuit 120, connects word lines WL0 to WL31 and select lines SSL and DSL of a selected memory block BK to global lines, and delivers the operation voltage through corresponding lines The page buffer group 150 includes page buffers PB coupled to a pair of bit lines, odd bit line BLo and even bit line BLe. The page buffers PB operate in a program operation, a read operation or an erase operation in response to page buffer signals PB SIGNALS outputted from the control circuit 120.

The connection details among the memory cells in the memory block BK, word lines WL0 to WL31, bit lines BLe and BLo, and page buffers PB will be described in detail below.

The Y decoder 160 provides an input/output path of data between the IO circuit 170 and the page buffer group 150 in response to column address CADD inputted from the control circuit 120.

The IO circuit 170 delivers a command CMD, an address ADD and data DATA inputted to the semiconductor memory device to the Y decoder 160 or the control circuit 120, or outputs data transmitted through the Y decoder 160 to an external component.

The control circuit 120 outputs the voltage control signal, the page buffer control signals PB SIGNALS, the column address CADD, the row address RADD, etc. in response to the command CMD and the address ADD delivered from the IO circuit 170.

Hereinafter, the connection details of the memory block BK and the page buffer PB will be described in detail.

Figure 2:
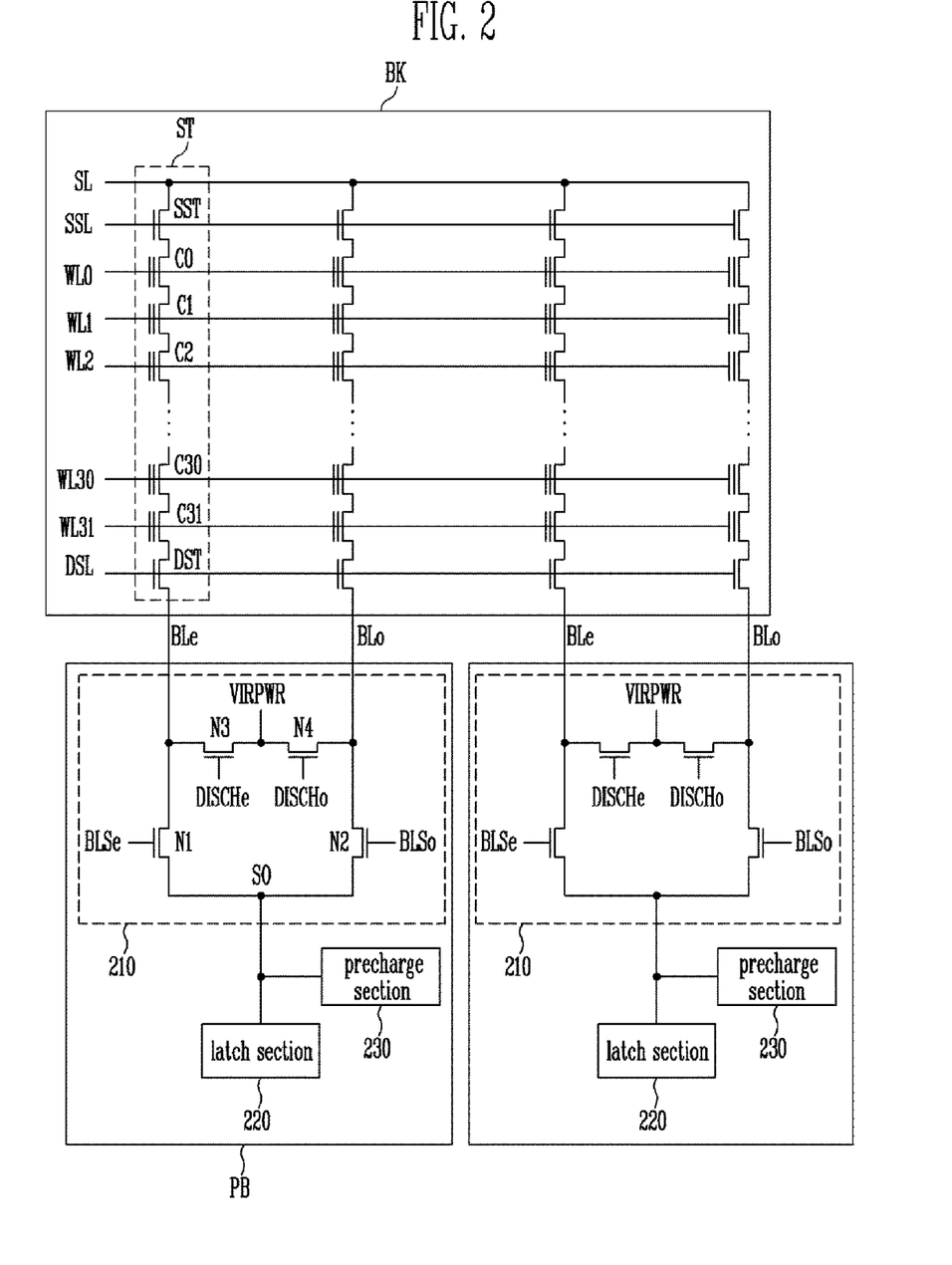
FIG. 2 is a view illustrating the connection details of a memory block and a page buffer in FIG. 1.

FIG. 2 is a view illustrating connection details of a memory block and a page buffer in FIG. 1.

The semiconductor memory device uses a structure ABL (all bit line) where each bit line is coupled to a page buffer and a structure EOBL (even odd bit line) where each pair of even and odd bit lines is coupled to the page buffer.

FIG. 2 is a view illustrating a structure where a page buffer is coupled to each pair of even bit line BLe and odd bit line BLo.

In FIG. 2, the memory block BK includes cell strings ST each coupled to a bit line. The even bit line BLe and the odd bit line BLo form one pair of bit lines and a structure where one pair of the bit lines is coupled to one page buffer PB.

Each cell string ST in the memory block BK includes a 0th to a thirty-first memory cell C0 to C31 connected in serial between a source select transistor SST and a drain select transistor DST.

Sources of the source select transistors SST in the cell strings ST are commonly connected to a common source line SL. A gate of the source select transistor SST is coupled to a source select line SSL.

Gates of the 0th to the thirty-first memory cell C0 to C31 are respectively coupled to a 0th to a thirty-first word line WL0 to WL31, and a gate of the drain select transistor DST is coupled to the drain select line DSL. A drain of the drain select transistor is coupled to a corresponding bit line.

The page buffer PB coupled to a pair of even bit line BLe and odd bit line BLo includes a bit line select section 210, a latch section 220 and a precharge section 230.

The bit line select section 210 includes a first to a fourth NMOS transistor N1 to N4. The first NMOS transistor N1 is connected between the even bit line BLe and a sensing node SO, and a second NMOS transistor N2 is connected between the odd bit line BLo and the sensing node SO.

An even bit line select signal BLSe is inputted to a gate of the first NMOS transistor N1, and an odd bit line select signal BLSo is inputted to a gate of the second NMOS transistor N2.

The third NMOS transistor N3 and the fourth NMOS transistor N4 are connected in serial between the even bit line BLe and the odd bit line BLo.

A variable voltage VIRPWR is applied to a node between the third NMOS transistor N3 and the fourth NMOS transistor N4. An even discharge signal DISCHe is inputted to a gate of the third NMOS transistor N3, and an odd discharge signal DISCHo is inputted to a gate of the fourth NMOS transistor N4.

The latch section 220 is coupled to the sensing node SO, and includes at least one latch circuit for a program and read operation.

The precharge section 230 precharges the sensing node SO in response to a control signal inputted from the control circuit 120.

Hereinafter, the read operation of the semiconductor memory device will be described in detail.

Figure 3:
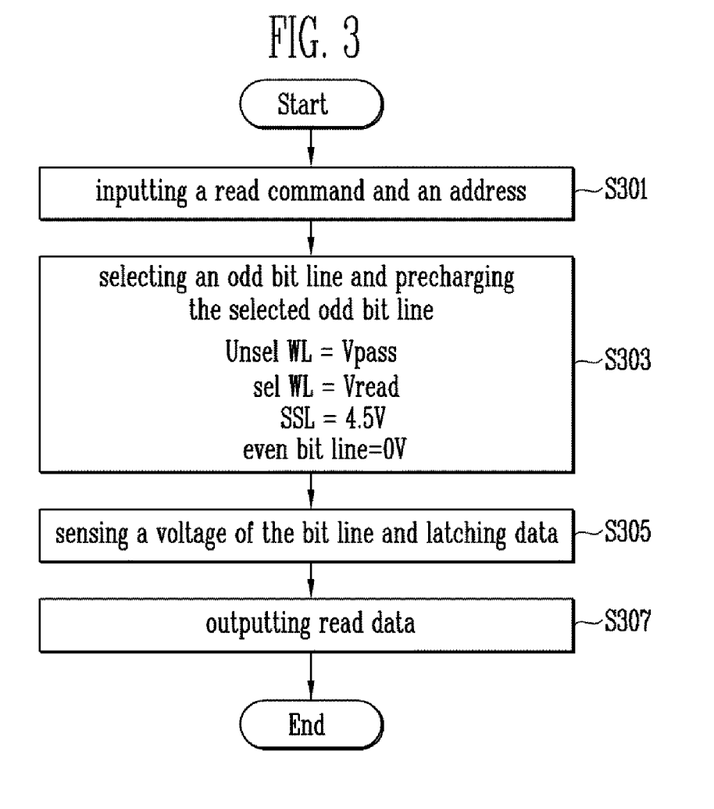
FIG. 3 is a flowchart illustrating a read operation of data.

FIG. 3 is a flowchart illustrating a read operation of data.

The read operation in FIG. 3 will be described with reference to FIG. 1 and FIG. 2.

In step S301, a read command and an address for reading data are inputted through the IO circuit 170. The IO circuit 170 delivers the inputted read command the address to the control circuit 120.

The control circuit 120 transmits the voltage control signal to generate a read voltage in response to the read command to the voltage supplement circuit 130, and provides the column address CADD and the row address RADD in response to the address to the Y decoder 160 and the X decoder 140, respectively.

In step S303, if data is read from memory cells coupled to the odd bit lines BLo of the first word line WL1 in response to the address, the control circuit 120 selects the odd bit lines BLo by controlling the page buffers PB and precharges the selected odd bit lines BLo.

To precharge the odd bit lines BLo, the precharge section 230 in the page buffer PB precharges the sensing node SO, and provides the odd bit line select signal BLSo having a first sensing voltage V1. The even bit line select signal BLSe is provided with a low level voltage.

The read voltage Vread is applied to the first word line WL1 which is a selected word line Sel WL, and the pass voltage Vpass is provided to non-selected word lines Unsel WL. A ground voltage is applied to the common source line SL, and the source select transistor SST is turned on by applying 4.5V to the source select line SSL.

When a threshold voltage of a memory cell coupled to the odd bit line corresponding to the first word line WL1 is more than the read voltage Vread, every odd bit line BLo form a channel of a memory cell coupled to a second word line WL2 adjacent to the first word line WL1, and is precharged to a voltage (V1-Vt). This is because the memory cell coupled to the first word line WL1 is turned off by the read voltage Vread. The voltage Vt is a threshold voltage of the second NMOS transistor N2.

When the threshold voltage of the memory cell coupled to the first word line WL1 is smaller than the read voltage Vread, the odd bit line BLo has 0V. This is because the precharge voltage applied to the odd bit line BLo is discharged in a direction towards the common source line SL as the memory cell of the first word line WL1 is turned on by the read voltage Vread.

0V is applied to the non-selected even bit line BLe while the odd bit line BLo is precharged. The variable voltage VIRPWR is set to 0V to apply 0V to the even bit line BLe, which is maintained providing the even discharge signal DISCHe with a high voltage level.

When precharging the odd bit line BLo is complete, a voltage of the odd bit line BLo is sensed and is latched in the latch section 220 in the page buffer PB in step S305. This step also includes the precharge section 230 precharging the sensing node SO and then providing the odd bit line select signal BLSo with a second sensing voltage V2.

When the odd bit line select signal BLSo is provided with the second sensing voltage V2, the second NMOS transistor N2 is either turned on or off in response to the voltage of the odd bit line BLo. When the voltage of the odd bit line BLo is higher than 'V2-Vt', the second NMOS transistor N2 is turned off. However, when the voltage of the odd bit line BLo is smaller than 'V2-Vt', the second NMOS transistor N2 is turned on. In other words, the second NMOS transistor N2 stays turned off because the odd bit line BL0 is precharged to a voltage (V1-Vt) when the threshold voltage of the selected memory cell is higher than the read voltage Vread.

The second NMOS transistor N2 is turned on because the odd bit line BLo has 0V when the threshold voltage of the selected memory cell is smaller than the read voltage Vread.

When the second NMOS transistor N2 is turned off, the sensing node SO maintains its precharging state. When the second NMOS transistor N2 is turned on, the precharge voltage of the sensing node SO is discharged by charge sharing.

Read data is stored in the latch section 220 in response to the voltage of the sensing node SO and is outputted to external components through the Y decoder 160 and the IO circuit 170 in step S307.

The intensity of cell current passing through the selected memory cell is an important factor in a process which calls for changing the voltage of the sensing node SO after the odd bit line select signal BLSo is provided with the second sensing voltage V2.

If the cell current does not have adequate intensity, the charge sharing is not normally performed even though the second NMOS transistor N2 is turned on, so a problem exists in that the sensing node SO is not discharged.

To solve the problem, either the cell current should be set to a high intensity or the cell current should not decrease.

Another reason why the cell current decreases is that the active area of the memory cell shrinks due to cross coupling between adjoining bit lines.

Hereinafter, this will be described in detail.

Figure 4:
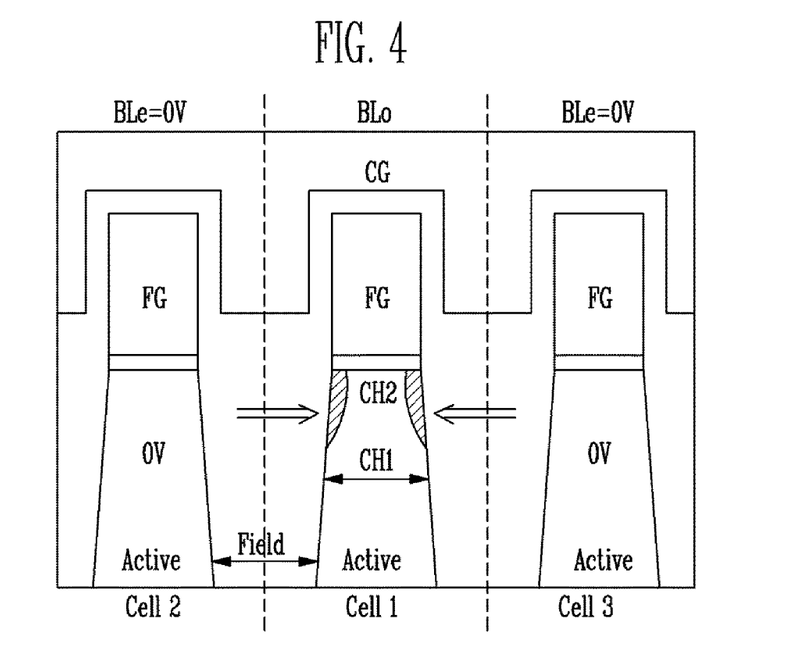
FIG. 4 is a view illustrating an active area of a memory cell when a read operation in FIG. 3 is performed.

FIG. 4 is a view illustrating an active area of a memory cell when a read operation in FIG. 3 is performed.

During the read operation, the odd bit line BLo is selected and precharged, and 0V is applied to the even bit line BLe.

FIG. 4 shows a part of the memory cells coupled to the selected word line Sel WL.

When active areas of the memory cells Cell2 and Cell3, coupled to the even bit line BLe disposed at the peripheral of a memory cell Cell1 coupled to the odd bit line BLo, all have 0V, cross coupling occurs between the memory cell Cell2, Cell3 and the memory cell Cell1, thereby shrinking the active area of memory cell Cell1.

When the active area of the memory cell Cell1 shrinks, a channel CH1 is narrowed to a shorter channel CH2, thereby decreasing the cell current of the active area.

As described above, the active area of the memory cell Cell1 coupled to the selected bit line is narrowed when adjacent bit lines have 0V in the read operation, thereby reducing cell current. To address this problem, the present invention provides the following read operation.

Figure 5:
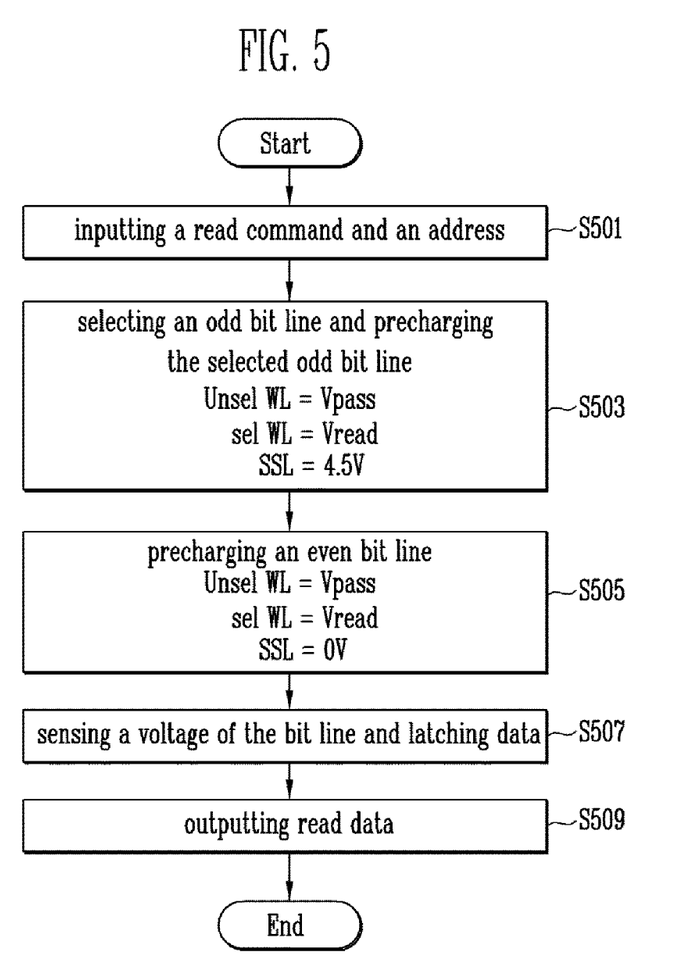
FIG. 5 is a flowchart illustrating a read operation in response to an embodiment of the present invention.

FIG. 5 is a flowchart illustrating a read operation in response to an embodiment of the present invention.

The read operation in FIG. 5 is a read method applied to a structure where one page buffer is coupled to one pair of even bit line BLe and odd bit line BLo. Hereinafter, it is assumed that a first word line WL1 and odd bit lines BLo are selected when the read operation is performed.

In FIG. 5, a read command and an address are inputted in step S501, and the selected odd bit lines BLo are precharged when the read operation starts in step S503.

The precharge section 230 in the page buffer PB precharges the sensing node SO to precharge the odd bit lines BLo.

When the odd bit line select signal BLSo having the first sensing voltage V1 is provided, the second NMOS transistor N2 is turned on. A read voltage Vread is applied to the first word line WL1 as the selected word line Sel WL, and a pass voltage Vpass is provided to the other non-selected word lines Unsel WL.

The source select transistor SST and the drain select transistor DST are turned on by applying 4.5V to the source select line and the drain select line. 0V is applied to the common source line SL.

When voltages are applied as mentioned above, voltages of the odd bit lines BLo are 'V1-Vt' or 0V in response to the threshold voltage of a selected memory cell.

When the threshold voltage of the selected memory cell is higher than the read voltage Vread, the selected memory cell is turned off. Accordingly, a the odd bit line BLo is precharged with a voltage 'V1-Vt' by a channel of the memory cell coupled to a second word line WL2.

When the threshold voltage of the selected memory cell is smaller than the read voltage Vread, the selected memory cell is turned on, and the odd bit line BLo is discharged to 0V.

When precharging of the odd bit lines BLo is complete, the even bit lines BLe, i.e. non-selected bit lines, are precharged in step S505.

One of following two methods may be incorporated as a method of precharging the even bit line BLe.

The read voltage Vread is applied to the first word line WL1 as the selected word line, and the pass voltage Vpass is provided to the non-selected word lines Unsel WLs. 4.5V is applied to the drain select line DSL, and 0V is provided to the source select line SSL. As a result, the drain select transistor DST is turned on, and the source select transistor SST is turned off.

Like the process of precharging the odd bit line BLo, the sensing node SO is precharged, and the even bit line BLe is precharged by providing the even bit line select signal BLSe with a voltage equivalent to the first sensing voltage V1 or higher.

In an embodiment of the present invention, the even bit line BLe may be precharged by applying the variable voltage VIRPWR as a precharge voltage and providing the even discharge signal DISCHe with a high voltage level, rather than being precharged through the sensing node SO.

In steps S507 and S509, a voltage of the odd bit line BLo is sensed after the even bit line BLe as the non-selected bit line is precharged, data corresponding to the sensed voltage is latched, and the latched data is outputted.

The steps S507 and S509 are similar as the steps S305 and S307 in FIG. 3.

When the above read operation is performed, cell current may be prevented from decreasing when the voltage of the selected bit line is sensed.

Figure 6:
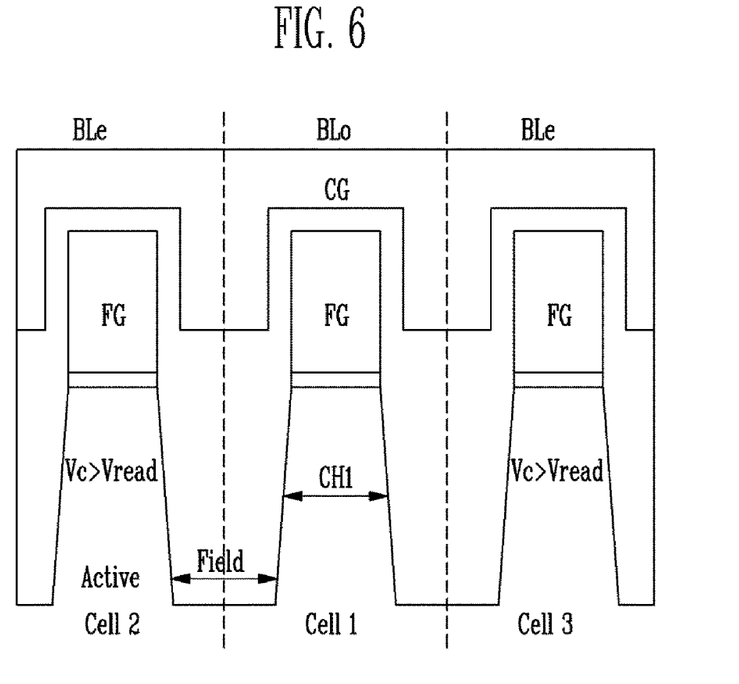
FIG. 6 is a view illustrating an active area of a memory cell when the read operation in FIG. 5 is performed.

FIG. 6 is a view illustrating an active area of a memory cell when the read operation in FIG. 5 is performed.

FIG. 6 shows a memory cell Cell1 coupled to a selected odd bit line BLo of the present invention and memory cells Cell2 and Cell3 coupled to the even bit lines BLe adjacent to the odd bit line BLo.

In each memory cells Cell1 to Cell3, a floating gate FG is formed in the active area, and a control gate CG is formed on the floating gate FG.

As described in FIG. 5, a channel voltage Vc greater than a read voltage is applied to the active areas of memory cells Cell2 and Cell3 coupled to the even bit line BLe. The read voltage Vread or a channel voltage less than the read voltage Vread is applied to the active area of the memory cell Cell1 coupled to the odd bit line BLo. Accordingly, since cross coupling by the even bit line BLe does not occur, depletion does not occur in the active area of the memory cell Cell1, thereby not narrowing channel CH1. As a result, cell current passing through the memory cell Cell1 is mantained.

The voltage of the odd bit line BLo may be normally sensed because the cell current is maintained in the step S507, and thus the read data corresponding to the sensed result may be latched.

In the above FIG. 5 and FIG. 6, the page buffer is coupled to a pair of even bit line BLe and odd bit line BLo. Hereinafter, a read operation in a structure where one page buffer is coupled to one bit line will be described below.

Figure 7:
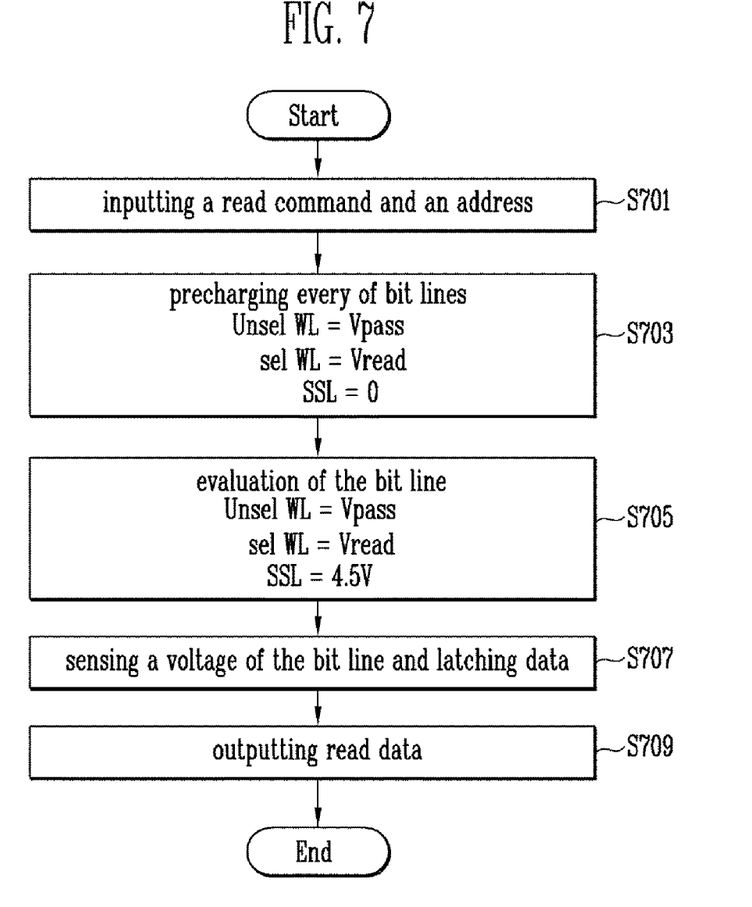
FIG. 7 is a flowchart illustrating a read operation in response to another embodiment of the present invention.

FIG. 7 is a flowchart illustrating a read operation in response to an embodiment of the present invention.

In FIG. 7, when one page buffer is coupled to one bit line, the bit lines need not be separated into the selected bit line and the non-selected bit line when a read operation is performed unlike in FIG. 5.

The present embodiment precharges a channel of a cell string by turning off the source select transistor when the bit line is precharged.

A read command and an address for the read operation are inputted in step S701, and a precharge operation of the bit line is performed when the read operation starts in step S703.

Since one page buffer is coupled to one bit line as described above, every bit line is selected. A read voltage Vread is applied to a selected word line Sel WL, and a pass voltage Vpass is provided to a non-selected word line Unsel WL. In addition, the source select transistor is turned off by applying 0V to the source select line SSL in response to a embodiment. The drain select transistor is turned on by applying 4.5V to the drain select line DSL.

A precharge voltage in accordance with the sensing node SO in the page buffer or a variable voltage is applied to every bit line.

The precharge voltage applied to the bit line is precharged to a cell string since the source select transistor is turned off.

In step S705, an evaluation whether to change a voltage of the bit line is performed in response to the program state of a selected memory cell after the bit line is precharged.

When the evaluation is performed, the voltage applied to the source select line SSL is changed from 0V to 4.5V, thereby turning on the source select transistor.

When the threshold voltage of the selected memory cell is greater than the read voltage Vread, the corresponding memory cell is turned off, and when the threshold voltage of the selected memory cell is less than the read voltage Vread, the corresponding memory cell is turned on. The voltage precharged to the bit line is either maintained or evaluated, in which the voltage of the bit line is discharged to the common source line through the source select line.

In step S707, the voltage of the bit line is sensed after the evaluation of the bit line is complete, and an operation of outputting read data corresponding to the sensed result is performed in step S709.

The read operation when one page buffer is coupled to one bit line is similar to a common read operation. However, the source select transistor is turned off when the bit line is precharged, thus precharging the channel of the cell string. As a result, the active area may not be reduced, and the cell current is maintained.

Although embodiments have been described with reference to a number of illustrative embodiments thereof, it should be understood that numerous other modifications and embodiments can be devised by those skilled in the art that will fall within the spirit and scope of the principles of this disclosure.

What is claimed is:

1. A method of operating a semiconductor memory device, the method comprising:
   selecting an even bit line or an odd bit line in response to a read command, and precharging a selected bit line by applying a precharge voltage to the selected bit line;
   changing potential of the selected bit line in response to a threshold voltage of a selected memory cell coupled to the selected bit line;
   precharging an unselected bit line by applying a precharge voltage to the unselected bit line after the potential of the selected bit line is changed; and
   sensing read data according to the potential of the selected bit line after the unselected bit line is precharged.

2. The method of claim 1, wherein the changing of the potential of the selected bit line includes:
   turning on drain select transistors and source select transistors coupled to the even and the odd bit lines, and applying a ground voltage to a common source line coupled to the source select transistors;
   applying a read voltage to a word line coupled to the selected memory cell;
   applying a pass voltage to unselected word lines coupled to unselected memory cells; and
   precharging a sensing node in a page buffer coupled to the selected bit line and subsequently connecting the sensing node to the selected bit line.

3. The method of claim 2, wherein potential of the precharged selected bit line is maintained when the threshold voltage of the selected memory cell is greater than the read voltage, and the potential of the precharged selected bit line is discharged when the threshold voltage of the selected memory cell is less than the read voltage.

4. The method of claim 2, wherein the step of applying the precharge voltage to the unselected bit line includes:
   turning on the drain select transistors and turning off the source select transistors;
   applying the read voltage to the word line coupled to the selected memory cell;
   applying the pass voltage to the unselected word lines coupled to the unselected memory cell; and
   precharging the sensing node in the page buffer coupled to the unselected bit line and subsequently connecting the sensing node to the unselected bit line.

5. The method of claim 2, wherein the step of applying the precharge voltage to the unselected bit line includes:
   turning on the drain select transistors, and turning off the source select transistor;
   applying the read voltage to the word line coupled to the selected memory cell;
   applying the pass voltage to the unselected word lines coupled to the unselected memory cell; and
   applying a variable voltage inputted to a page buffer coupled to the unselected bit line.

6. The method of claim 1, wherein a channel voltage greater than the read voltage is applied to active areas of memory cells coupled to the unselected bit line.

7. The method of claim 1, wherein a read voltage or a channel voltage less than the read voltage is applied to an active area of the selected memory cell coupled to the selected bit line.

8. A method of operating a semiconductor memory device, the method comprising:
- turning off source select transistors of cell strings in response to a read command;
- precharging a first bit line by applying a precharge voltage to the first bit line coupled to a first cell string among the cell strings;
- turning on the source select transistors of the cell strings after the first bit line is precharged;
- changing potential of the first bit line in response to a threshold voltage of a selected memory cell included in the first cell string after the source select transistors are turned on;
- precharging a second bit line adjacent to the first bit line by applying the precharge voltage to the second bit line after the potential of the first bit line is changed; and
- sensing read data in response to a voltage of the first bit line after the second bit line is precharged.

9. The method of claim 8, wherein when the precharging of the first bit line and the changing of the potential of the first bit line are performed, a read voltage is applied to a word line coupled to the selected memory cell, and a pass voltage is applied to the other word lines.

10. The method of claim 8, wherein the precharging of the first bit line includes:
- precharging a sensing node of a page buffer coupled to each of the cell strings; and
- precharging the first bit line by connecting the sensing node of the page buffer to the first bit line by turning on a drain select transistor of each of the cell strings.

11. The method of claim 8, wherein the precharging of the first bit line includes:
- applying a variable voltage inputted to a page buffer coupled to each of the cell strings to the first bit line by turning on a drain select transistor of each of the cell strings.

12. The method of claim 8, wherein the precharged potential of the first bit line is maintained when the threshold voltage of the selected memory cell is greater than the read voltage, and the precharged potential of the first bit line is discharged when the threshold voltage of the selected memory cell is less than the read voltage.

* * * * *